(12) United States Patent
Zhang et al.

(10) Patent No.: US 11,903,297 B2
(45) Date of Patent: Feb. 13, 2024

(54) DISPLAY PANEL, MANUFACTURING METHOD, DRIVING METHOD AND DISPLAY DEVICE

(71) Applicant: BOE Technology Group Co., Ltd., Beijing (CN)

(72) Inventors: Lizhen Zhang, Beijing (CN); Sheng Xu, Beijing (CN); Wei He, Beijing (CN); Yi Zhou, Beijing (CN); Qi Yao, Beijing (CN); Wusheng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 324 days.

(21) Appl. No.: 17/333,202

(22) Filed: May 28, 2021

(65) Prior Publication Data

US 2022/0130919 A1 Apr. 28, 2022

(30) Foreign Application Priority Data

Oct. 26, 2020 (CN) .......................... 202011159401.3

(51) Int. Cl.
*G09G 3/00* (2006.01)
*H10K 59/65* (2023.01)
(Continued)

(52) U.S. Cl.
CPC ......... *H10K 59/65* (2023.02); *G06F 3/04166* (2019.05); *G06V 40/1318* (2022.01);
(Continued)

(58) Field of Classification Search
CPC .... H10K 59/65; H10K 59/131; H10K 59/121; G06F 3/04166; G06V 40/1318;
(Continued)

(56) References Cited

U.S. PATENT DOCUMENTS 11,402,700 B2 * 8/2022 Ma .......................... H04N 23/57
2018/0033835 A1 2/2018 Zeng et al.
(Continued)

FOREIGN PATENT DOCUMENTS

| CN | 107230698 A | 10/2017 |
|---|---|---|
| CN | 108766987 A | 11/2018 |

(Continued)

OTHER PUBLICATIONS

Office Action in CN202011159401.3, dated Nov. 16, 2023, 6 pages.

*Primary Examiner* — Michael A Faragalla
(74) *Attorney, Agent, or Firm* — ArentFox Schiff LLP; Michael Fainberg

(57) ABSTRACT

The present disclosure discloses a display panel, a manufacturing method, a driving method and a display device. When the display panel needs to display a normal image, a pixel driving circuit and a first control circuit drive an organic light emitting diode to emit light. When the display panel needs to perform fingerprint detection of a finger, the pixel driving circuit and a second control circuit drive a micro light emitting diode to emit light, so that the light emitted by the micro light emitting diode can be received by a photoelectric converter after being reflected by the finger, the photoelectric converter can output a detection signal, and furthermore, fingerprint information of the finger can be determined according to the detection signal.

16 Claims, 4 Drawing Sheets

(51) Int. Cl.
    *G06F 3/041*      (2006.01)
    *G06V 40/13*      (2022.01)
    *G09G 3/3233*     (2016.01)
    *H10K 59/121*     (2023.01)
    *H10K 59/131*     (2023.01)

(52) U.S. Cl.
    CPC ......... *G09G 3/3233* (2013.01); *H10K 59/121* (2023.02); *H10K 59/131* (2023.02); *G09G 2300/0842* (2013.01); *G09G 2354/00* (2013.01)

(58) Field of Classification Search
    CPC ......... G09G 3/3233; G09G 2300/0842; G09G 2354/00; H01L 25/18; H01L 27/32
    See application file for complete search history.

(56) References Cited

U.S. PATENT DOCUMENTS

2020/0312832 A1* 10/2020 Chi .................. H10K 59/353
2021/0405464 A1   12/2021 Ma
2022/0013578 A1    1/2022 Ikeda et al.

FOREIGN PATENT DOCUMENTS

| CN | 109962092 A | 7/2019 |
| CN | 110928024 A | 3/2020 |
| WO | 2020196789 A1 | 10/2020 |

\* cited by examiner

DISPLAY PANEL, MANUFACTURING METHOD, DRIVING METHOD AND DISPLAY DEVICE

CROSS-REFERENCE TO RELATED APPLICATION

This application is based on and claims priority under 35 U.S.C 119 to Chinese Patent Application No. 202011159401.3, filed on Oct. 26, 2020, in the China National Intellectual Property Administration. The entire disclosure of the above application is incorporated herein by reference.

FIELD

The present disclosure relates to the technical field of display, in particular to a display panel, a manufacturing method, a driving method and a display device.

BACKGROUND

With rapid development of the technology, mobile products with a biological recognition function gradually come into people's lives. The fingerprint is a characteristic which is inherent and unique to a human body, human bodies can be distinguished through fingerprints, the fingerprint consists of a series of valleys and ridges on the surface of the skin at a finger tip, the composition details of the valleys and the ridges generally include branches of the ridges, ends of the ridges, arches, tent-like arches, left spirals, right spirals, spirals or double spirals, and determine the uniqueness of the fingerprint, and thus, the mobile products with the biological recognition function have received extensive attention.

SUMMARY

An embodiment of the present disclosure provides a display panel, including: a base substrate with a display area; the display area includes a plurality of sub-pixels; wherein the display area includes a recognition area; and each sub-pixel in the recognition area includes: a pixel driving circuit, a first control circuit, a second control circuit, an organic light emitting diode, a micro light emitting diode and a photoelectric converter;
  in each sub-pixel, the organic light emitting diode is electrically connected with the pixel driving circuit through the first control circuit, and the micro light emitting diode is electrically connected with the pixel driving circuit through the second control circuit; and
  the photoelectric converter is configured to receive light emitted by the micro light emitting diode and is reflected by a finger.
  In some embodiments, the display panel includes:
  a driving array layer, positioned on the base substrate, and the driving array layer including the pixel driving circuit, the first control circuit and the second control circuit;
  a first insulating layer, positioned on a side, facing away from the base substrate, of the driving array layer;
  a photoelectric device layer, positioned on a side, facing away from the base substrate, of the first insulating layer, and the photoelectric device layer including the photoelectric converter;
  a second insulating layer, positioned on a side, facing away from the base substrate, of the photoelectric device layer;
  a first light emitting structure layer, positioned on a side, facing away from the base substrate, of the second insulating layer, and the first light emitting structure layer including the organic light emitting diode;
  a third insulating layer, positioned on a side, facing away from the base substrate, of the first light emitting structure layer; and
  a second light emitting structure layer, positioned on a side, facing away from the base substrate, of the third insulating layer, and the second light emitting structure layer including the micro light emitting diode.
  In some embodiments, the photoelectric device layer includes:
  a first conducting layer, positioned on the side, facing away from the base substrate, of the first insulating layer, and the first conducting layer including a first control switching portion and a first electrode of the photoelectric converter;
  a photoelectric conversion structure layer, positioned on a side, facing away from the base substrate, of the first conducting layer, and the photoelectric conversion structure layer including a photoelectric conversion layer of the photoelectric converter; and
  a second conducting layer, positioned on a side, facing away from the base substrate, of the photoelectric conversion structure layer, and the second conducting layer including a second electrode of the photoelectric converter; wherein
  the first control circuit is electrically connected with the first control switching portion through a first via hole penetrating through the first insulating layer, and the first control switching portion is electrically connected with a first electrode of the organic light emitting diode through a second via hole penetrating through the second insulating layer.
  In some embodiments, the first conducting layer further includes a second control switching portion; wherein the second control circuit is electrically connected with the second control switching portion through a third via hole penetrating through the first insulating layer; and
  the second control switching portion is electrically connected with a first electrode of the micro light emitting diode through a fourth via hole penetrating through the second insulating layer and a fifth via hole penetrating through the third insulating layer.
  In some embodiments, the display panel further includes: a first connecting layer arranged on a layer same as a layer on which the first electrode of the organic light emitting diode is;
  the display panel further includes: a second connecting layer positioned between the third insulating layer and the second light emitting structure layer, and an anisotropic conductive adhesive film positioned between the second connecting layer and the second light emitting structure layer; and
  the second control switching portion is electrically connected with the first connecting layer through the fourth via hole, the first connecting layer is electrically connected with the second connecting layer through the fifth via hole, and the second connecting layer is electrically connected with the first electrode of the micro light emitting diode through the anisotropic conductive adhesive film.
  In some embodiments, the second light emitting structure layer includes:
  a reflective conducting layer, positioned on the side, facing away from the base substrate, of the third insulating layer, and the reflective conducting layer including a reflecting electrode; wherein an orthographic projection of the reflecting electrode on the base substrate is respectively not overlapped with an orthographic projection of an area, where the organic light emitting diode is located, on the base substrate and an orthographic projection of an area, where the photoelectric converter is located, on the base substrate; and the orthographic projection of the reflecting electrode on the base substrate covers an orthographic projection of an area, where the micro light emitting diode is located, on the base substrate;

a micro-device insulating layer, positioned on the side, facing away from the base substrate, of the reflective conducting layer;

a micro-device array layer, positioned on the side, facing away from the base substrate, of the micro-device insulating layer, and the micro-device array layer including the micro light emitting diode; and the reflecting electrode being electrically connected with the first electrode of the micro light emitting diode through a fifth via hole penetrating through the micro-device insulating layer, and a first connecting portion is electrically connected with the reflecting electrode through the anisotropic conductive adhesive film.

In some embodiments, the recognition area is overlapped with the display area.

A display device provided by an embodiment of the present disclosure includes the display panel.

A manufacturing method of the display panel provided by the embodiment of the present disclosure includes:

successively forming a driving array layer, a first insulating layer, a photoelectric device layer, a second insulating layer, a first light emitting structure layer and a third insulating layer on the base substrate; wherein the driving array layer includes the pixel driving circuit, the first control circuit and the second control circuit; the photoelectric device layer includes the photoelectric converter; the first light emitting structure layer includes the organic light emitting diode; wherein in the same sub-pixel, the organic light emitting diode is electrically connected with the pixel driving circuit through the first control circuit;

forming a second light emitting structure layer on a packaging substrate; wherein the second light emitting structure layer includes the micro light emitting diode; and oppositely arranging the formed base substrate and the packaging base substrate in a box alignment manner, and enabling the micro light emitting diode in each sub-pixel to be electrically connected with the pixel driving circuit through the second control circuit.

In some embodiments, the manufacturing method further includes: forming a first connecting layer while the first electrode of the organic light emitting diode is formed; wherein the first connecting layer is electrically connected with a second connecting portion through the fourth via hole penetrating through the second insulating layer;

the oppositely arranging the formed base substrate and the packaging substrate in the box alignment manner includes:
  forming a second connecting layer on the base substrate on which the third insulating layer is formed; wherein the second connecting layer is electrically connected with the first connecting layer through the fifth via hole penetrating through the third insulating layer;
  forming an anisotropic conductive adhesive film on the base substrate on which the second connecting layer is formed; or forming an anisotropic conductive adhesive film on the packaging substrate on which the second light emitting structure layer is formed; and
  after the formed base substrate and the packaging substrate are aligned, electrically connecting the second connecting layer on the base substrate with the first electrode of the micro light emitting diode on the packaging substrate through the anisotropic conductive adhesive film by using a hot-pressing technology.

A driving method of the display panel provided by an embodiment of the present disclosure includes:
  at a display stage, switching on the first control circuit, switching off the second control circuit, and transmitting, by the pixel driving circuit, a driving current to the organic light emitting diode, electrically connected with the pixel driving circuit, through the first control circuit so as to control the organic light emitting diode to emit light; and
  at a detection stage, detecting a touch area for fingers on the display panel, controlling the first control circuit in the touch area to be switched off, controlling the second control circuit to emit light, transmitting, by the pixel driving circuit, the driving current to the micro light emitting, electrically connected with the pixel driving circuit, through the second control circuit so as to control the micro light emitting diode to emit light; receiving, by the photoelectric converter, the light emitted by the micro light emitting diode and reflected by a finger, and outputting a detection signal; and determining fingerprint information of the finger according to the detection signal.

In some embodiments, at the detection stage, the driving method further includes:
  controlling the first control circuit in other areas except for the touch area to be switched on, controlling the second control circuit to be switched off, and transmitting, by the pixel driving circuit, the driving current to the organic light emitting diode, electrically connected with the pixel driving circuit, through the first control circuit so as to control the organic light emitting diode to emit light.

DETAILED DESCRIPTION OF THE EMBODIMENTS

Figure 1:
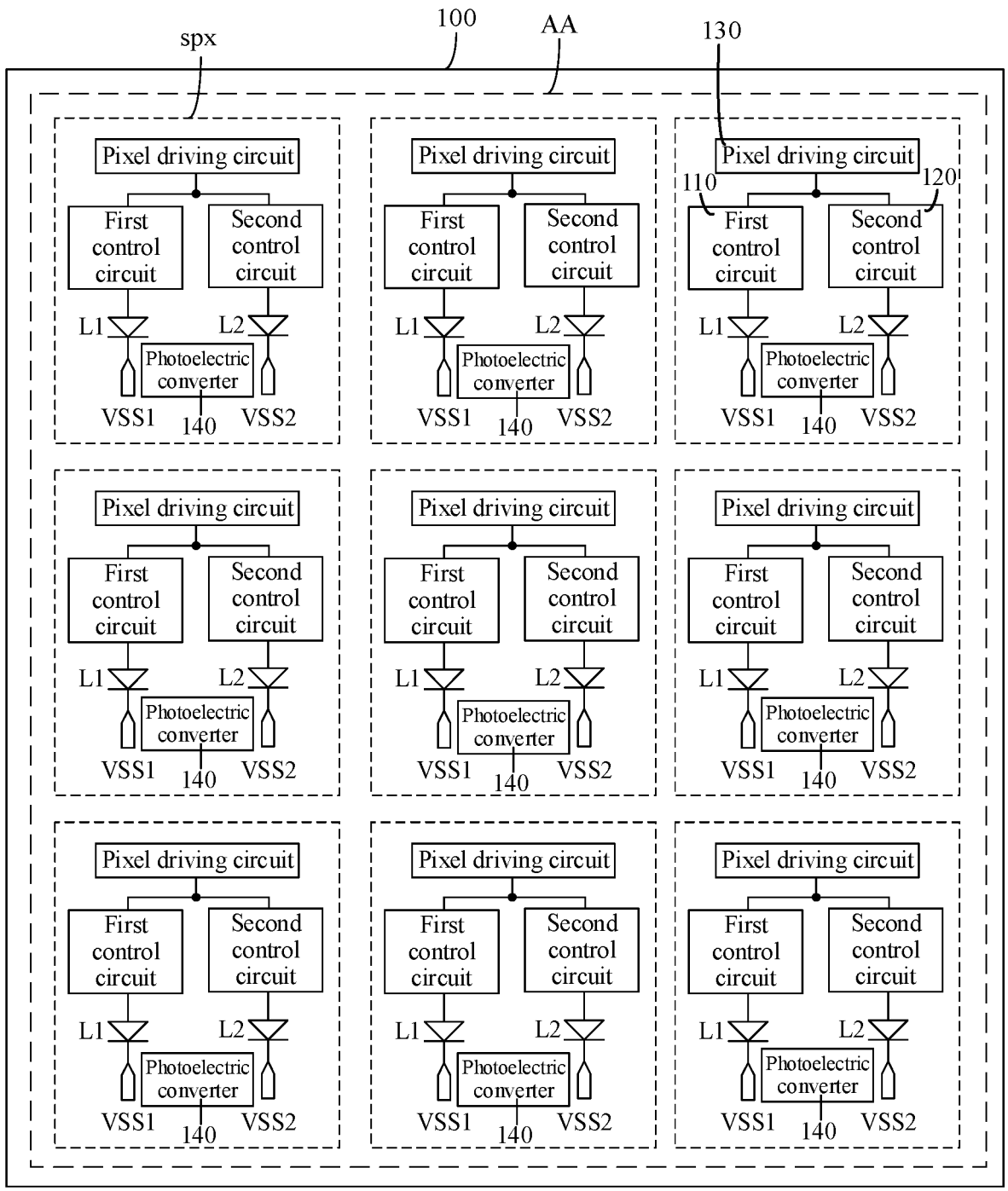
FIG. 1 is a structure diagram of a display panel in an embodiment of the present disclosure.

To make the objectives, technical solutions and advantages of the embodiments of the present disclosure more apparent, the technical solutions of the embodiments of the present disclosure will be clearly and completely described below with reference to the drawings of the embodiments of the present disclosure. It is obvious that the described embodiments are only a part of the embodiments of the present disclosure, and not all the embodiments. The embodiments of the present disclosure and features in the embodiments may be combined with each other without conflict. All other embodiments, which can be derived by a person skilled in the art from the described embodiments of the present disclosure without creative work, fall within the scope of protection of the present disclosure.

Unless defined otherwise, technical or scientific terms used herein shall have the ordinary meanings as understood by one of ordinary skill in the art to which the present disclosure belongs. The words "first," "second," and the like used in the present disclosure are not intended to indicate any order, quantity, or importance, but rather are used to distinguish one element from another. The word "including" or "includes" and the like means that the element or item preceding the word includes the element or item listed after the word and its equivalents, but does not exclude other elements or items. The term "connected" or "coupled" and the like is not restricted to physical or mechanical connection, but may include electrical connection, whether direct or indirect.

It should be noted that the sizes and shapes of the various figures in the drawings do not reflect real scales, but are merely intended to schematically illustrate the content of the present disclosure. The same or similar reference numerals refer to the same or similar elements or elements having the same or similar functions throughout.

An embodiment of the present disclosure provides a display panel. As shown in FIG. 1, the display panel may include: a base substrate 100 with a display area AA; the display area AA includes a plurality of sub-pixels spx; wherein the display area AA includes a recognition area; each sub-pixel spx in the recognition area includes: a pixel driving circuit 130, a first control circuit 110, a second control circuit 120, an organic light emitting diode L1, a micro light emitting diode L2 (such as a Micro LED) and a photoelectric converter 140. Moreover, in the same sub-pixel spx, the organic light emitting diode L1 is electrically connected with the pixel driving circuit 130 through the first control circuit 110, and the micro light emitting diode L2 is electrically connected with the pixel driving circuit 130 through the second control circuit 120; and the photoelectric converter 140 is configured to receive light emitted by the micro light emitting diode L2 and reflected by a finger.

According to the display panel provided by some embodiments of the present disclosure, when the display panel needs to display a normal image, the pixel driving circuit and the first control circuit drive the organic light emitting diode to emit light. When the display panel needs to perform fingerprint detection of a finger, the pixel driving circuit and the second control circuit drive the micro light emitting diode to emit light, so that the light emitted by the micro light emitting diode and reflected by the finger may be received by the photoelectric converter, the photoelectric converter may output a detection signal, and furthermore, the fingerprint information of the finger may be determined according to the detection signal.

In practical application, under the driving of the same current, the brightness of light emitted by the micro light emitting diode L2 is greater than that of light emitted by the organic light emitting diode L1. For example, the brightness of the light emitted by the micro light emitting diode L2 may reach four times as great as the brightness of the light emitted by the organic light emitting diode L1. Therefore, in the embodiment of the present disclosure, when the display panel needs to perform fingerprint detection of a finger, the micro light emitting diode L2 is driven to emit light, namely, the micro light emitting diode L2 is used as a point light source for fingerprint recognition to provide strong light, so that an optical signal sensed by the photoelectric converter 140 may be enhanced, the signal-to-noise ratio is further improved, and the defect that fingerprint recognition mass production may not be met due to insufficient light intensity when the organic light emitting diode L1 is used as a point light source is overcome.

In some embodiments of the present disclosure, the display area AA may include: a plurality of pixel units arranged in an array. Each pixel unit may include a plurality of sub-pixels. In some embodiments, each pixel unit may include a red sub-pixel, a green sub-pixel and a blue sub-pixel, so that color mixing may be carried out by using red, green and blue to realize color display. Alternatively, each pixel unit may also include a red sub-pixel, a green sub-pixel, a blue sub-pixel and a white sub-pixel, so that color mixing may be carried out by using red, green, blue and white to realize color display. Of course, in practical application, the light emitting colors of the sub-pixels in the pixel unit may be designed and determined according to a practical application environment, and are not limited herein.

In some embodiments of the present disclosure, as shown in FIG. 1, the recognition area may be overlapped with the display area AA, namely, the recognition area may be the display area AA. Therefore, the whole display area AA can realize optical fingerprint recognition.

Figure 2:
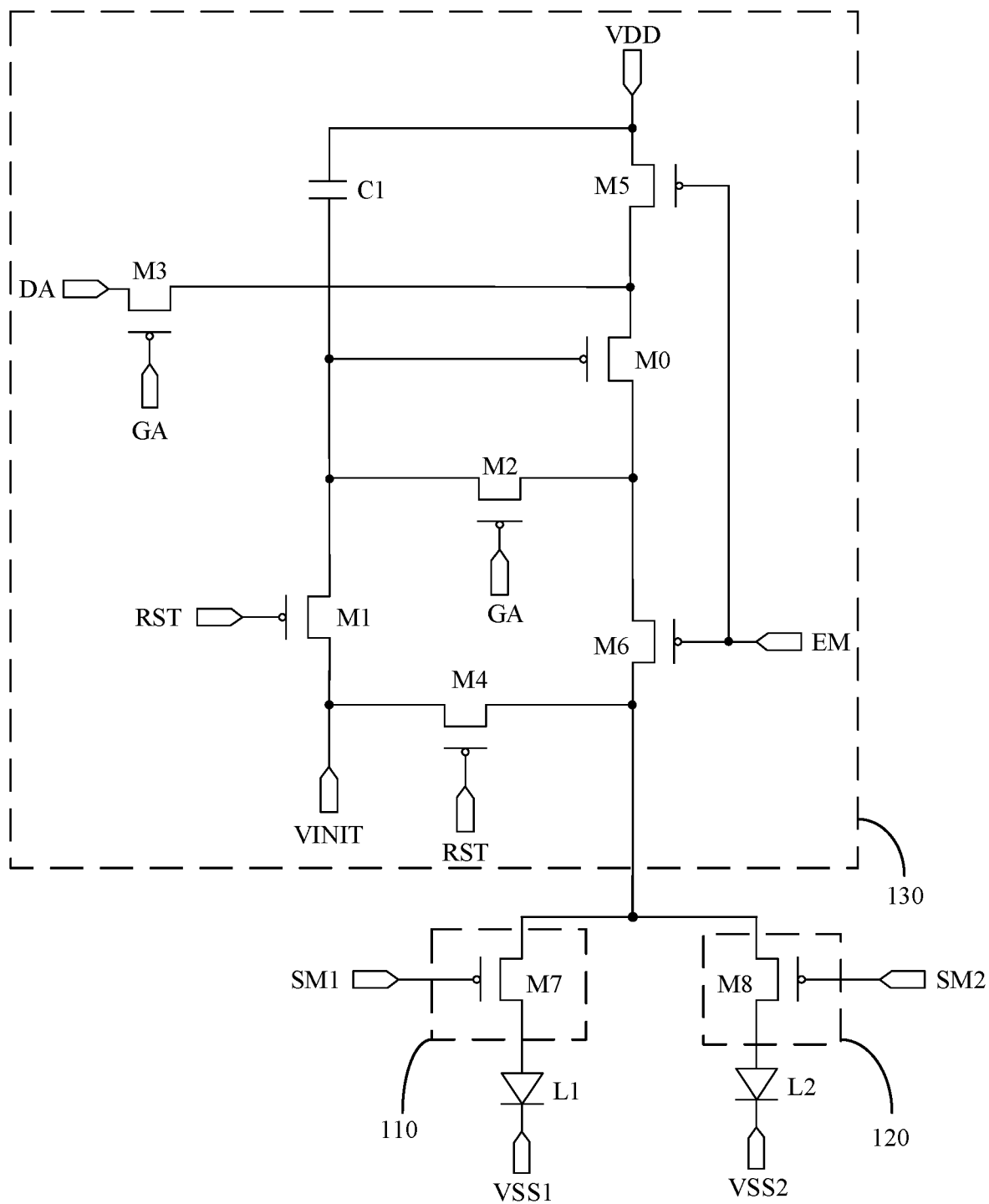
FIG. 2 is a structure diagram in sub-pixels in an embodiment of the present disclosure.

In some embodiments of the present disclosure, as shown in FIG. 2, a pixel driving circuit 130 may include: a first transistor M1 to a sixth transistor M6 as well as a storage capacitor C1. A first control circuit 110 may include: a seventh transistor M7. A second control circuit 120 may include: an eighth transistor M8.

A grid electrode of the first transistor M1 is electrically connected with a reset signal end RST, a first electrode of the first transistor M1 is electrically connected with an initialization signal end VINIT, and a second electrode of the first transistor M1 is electrically connected with a grid electrode of a driving transistor M0.

A grid electrode of the second transistor M2 is electrically connected with a scanning signal end GA, a first electrode of the second transistor M2 is electrically connected with a second electrode of the driving transistor M0, and a second electrode of the second transistor M2 is electrically connected with the grid electrode of the driving transistor M0.

A grid electrode of the third transistor M3 is electrically connected with the scanning signal end GA, a first electrode of the third transistor M3 is electrically connected with a data signal end DA, and a second electrode of the third transistor M3 is electrically connected with the first electrode of the driving transistor M0.

A grid electrode of the fourth transistor M4 is electrically connected with the reset signal end RST, a first electrode of the fourth transistor M4 is electrically connected with the initialization signal end VINIT, and a second electrode of the fourth transistor M4 is electrically connected with a second electrode of the sixth transistor M6.

A grid electrode of the fifth transistor M5 is electrically connected with a light emitting control signal end EM, a first electrode of the fifth transistor M5 is electrically connected with a first power end, and a second electrode of the fifth transistor M5 is electrically connected with the first electrode of the driving transistor M0.

A grid electrode of the sixth transistor M6 is electrically connected with the light emitting control signal end EM, a first electrode of the sixth transistor M6 is electrically connected with a second electrode of the driving transistor M0, and a second electrode of the sixth transistor M6 is electrically connected with a first electrode of the seventh transistor M7 in the first control circuit 110 and a first electrode of the eighth transistor M8 in the second control circuit 120.

A grid electrode of the seventh transistor M7 is electrically connected with a first selecting signal end SM1, and a second electrode of the seventh transistor M7 is electrically connected with a positive electrode of the organic light emitting diode L1. A negative electrode of the organic light emitting diode L1 is electrically connected with a second power end.

A grid electrode of the eighth transistor M8 is electrically connected with a second selecting signal end SM2, and a second electrode of the eighth transistor M8 is electrically connected with a positive electrode of the micro light emitting diode L2. A negative electrode of the micro light emitting diode L2 is electrically connected with a third power end.

It should be noted that the structure of the pixel driving circuit 130 may also be arranged as another structure and is not limited herein.

It should be noted that the first electrodes of the foregoing transistors may serve as source electrodes thereof and the second electrodes of the transistors may serve as drain electrodes thereof. Alternatively, the first electrodes of the transistors may serve as drain electrodes thereof and the second electrodes may serve as source electrodes thereof, and they are not distinguished herein.

In some embodiments of the present disclosure, a driving method of the display panel may include: at a display stage, a first control circuit is switched on, a second control circuit is switched off, and the pixel driving circuit transmits a driving current to the organic light emitting diode, electrically connected with the pixel driving circuit, through the first control circuit so as to control the organic light emitting diode to emit light.

Figure 3A:
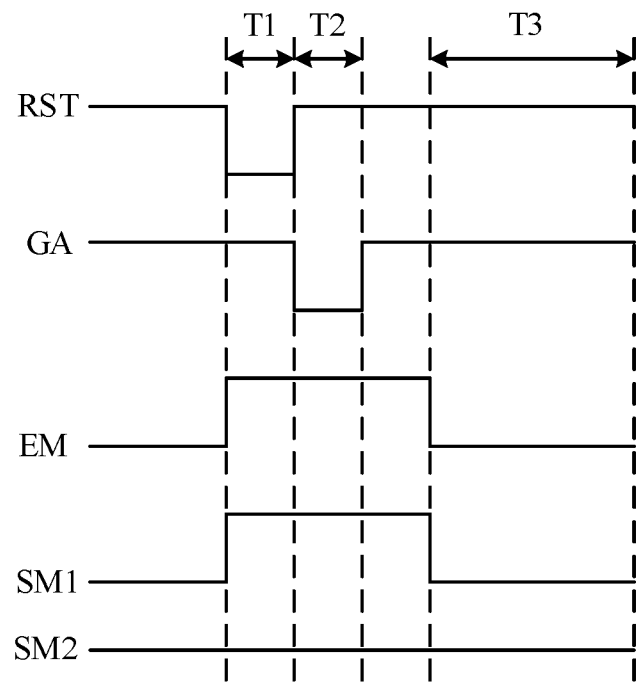
FIG. 3A is a timing diagram of some signals in an embodiment of the present disclosure.

The working process of the display panel displaying a normal image at the display stage is described below in combination with FIG. 2 and FIG. 3A. Only one sub-pixel is described below as an example. The sub-pixel spx may include a stage T1, a stage T2 and a stage T3 at the display stage. At the stage T1, the stage T2 and the stage T3 in the display stage, the eighth transistor M8 is switched off under the control of the second selecting signal end SM2.

At the stage T1, the first transistor M1 and the fourth transistor M4 are switched on under the control of the reset signal end RST. The first transistor M1 which is switched on provides a signal of the initialization signal end VINIT to the grid electrode of the driving transistor M0 so as to initialize the grid electrode of the driving transistor M0. The fourth transistor M4 which is switched on provides a signal of the initialization signal end VINIT to the second electrode of the sixth transistor M6 so as to initialize the second electrode of the sixth transistor M6. The second transistor M2 and the third transistor M3 are switched off under the control of the scanning signal end GA. The fifth transistor M5 and the sixth transistor M6 are switched off under the control of the light emitting control signal end EM. The seventh transistor M7 is switched off under the control of the first selecting signal end SM1.

At the stage T2, the second transistor M2 and the third transistor M3 are switched on under the control of the scanning signal end GA. The second transistor M2 which is switched on enables the driving transistor M0 to achieve a diode connection mode. The third transistor M3 which is switched on charges the grid electrode of the driving transistor M0 through the driving transistor M0 and the second transistor M2 according to a data signal of the data signal end DA so as to carry out threshold compensation. The first transistor M1 and the fourth transistor M4 are switched off under the control of the reset signal end RST. The fifth transistor M5 and the sixth transistor M6 are switched off under the control of the light emitting control signal end EM. The seventh transistor M7 is switched off under the control of the first selecting signal end SM1.

At the stage T3, the fifth transistor M5 and the sixth transistor M6 are switched on under the control of the light emitting control signal end EM. The seventh transistor M7 is switched on under the control of the first selecting signal end SM1. The fifth transistor M5 which is switched on enables the first power end to be connected with the first electrode of the driving transistor M0, so that the voltage of the first electrode of the driving transistor M0 is the voltage of the first power end. The driving transistor M0 generates a driving current under the control of the voltages of the grid electrode and the first electrode of the driving transistor M0. The sixth transistor M6 and the seventh transistor M7 which are switched on input the driving current into the organic light emitting diode L1 so as to drive the organic light emitting diode L1 to emit light.

In some embodiments of the present disclosure, the driving method of the display panel may include: at a detection stage, a touch area for fingers to touch on the display panel is determined, the first control circuit in the touch area is controlled to be switched off, the second control circuit is controlled to emit light, and the pixel driving circuit transmits the driving current to the micro light emitting diode, electrically connected with the pixel driving circuit, through the second control circuit so as to control the micro light emitting diode to emit light; the photoelectric converter receives the light emitted by the micro light emitting diode and reflected by a finger, and outputs a detection signal; and fingerprint information of the finger is determined according to the detection signal.

In some embodiments, a self-capacitance electrode or a mutual capacitance electrode may also be arranged in the display panel, so that the touch area for fingers to touch on the display panel is determined through the self-capacitance electrode or the mutual capacitance electrode when the fingers touch on the display panel.

Figure 3B:
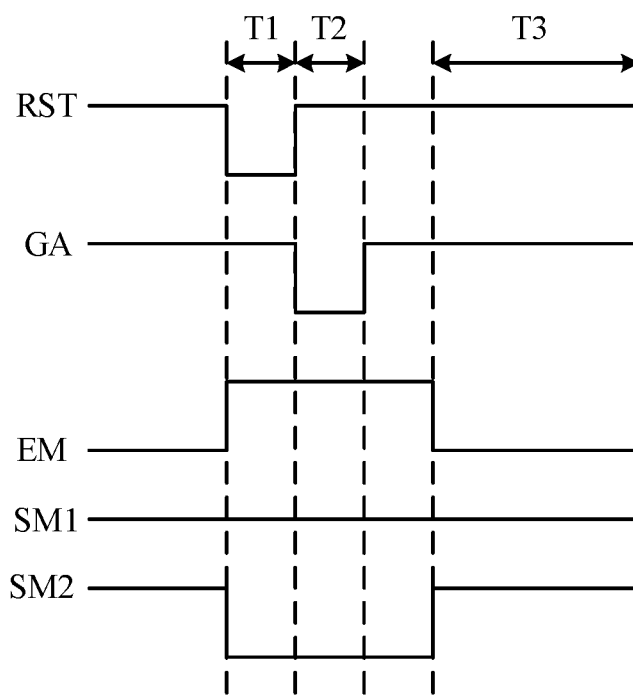
FIG. 3B is a timing diagram of some other signals in an embodiment of the present disclosure.

The working process of controlling the micro light emitting diode L2 to emit light at the detection stage of the display panel is described below in combination with FIG. 2 and FIG. 3B. Only one sub-pixel is described below as an example. The sub-pixel may include a stage T1, a stage T2 and a stage T3 at the display stage. At the stage T1, the stage T2 and the stage T3 in the detection stage, the seventh transistor M7 is switched off under the control of the first selecting signal end SM1.

At the stage T1, the first transistor M1 and the fourth transistor M4 are switched on under the control of the reset signal end RST. The first transistor M1 which is switched on provides a signal of the initialization signal end VINIT to the grid electrode of the driving transistor M0 so as to initialize the grid electrode of the driving transistor M0. The fourth transistor M4 which is switched on provides a signal of the initialization signal end VINIT to the second electrode of the sixth transistor M6 so as to initialize the second electrode of the sixth transistor M6. The second transistor M2 and the third transistor M3 are switched off under the control of the scanning signal end GA. The fifth transistor M5 and the sixth transistor M6 are switched off under the control of the light emitting control signal end EM. The eighth transistor M8 is switched off under the control of the second selecting signal end SM2.

At the stage T2, the second transistor M2 and the third transistor M3 are switched on under the control of the scanning signal end GA. The second transistor M2 which is switched on enables the driving transistor M0 to achieve a diode connection mode. The third transistor M3 which is switched on charges the grid electrode of the driving transistor M0 through the driving transistor M0 and the second transistor M2 according to the data signal of the data signal end DA so as to carry out threshold compensation. The first transistor M1 and the fourth transistor M4 are switched off under the control of the reset signal end RST. The fifth transistor M5 and the sixth transistor M6 are switched off under the control of the light emitting control signal end EM. The eighth transistor M8 is switched off under the control of the second selecting signal end SM2.

At the stage T3, the fifth transistor M5 and the sixth transistor M6 are switched on under the control of the light emitting control signal end EM. The eighth transistor M8 is switched on under the control of the second selecting signal end SM2. The fifth transistor M5 which is switched on enables the first power end to be connected with the first electrode of the driving transistor M0, so that the voltage of the first electrode of the driving transistor M0 becomes the voltage of the first power end. The driving transistor M0 generates a driving current under the control of the voltages of the grid electrode and the first electrode of the driving transistor M0. The sixth transistor M6 and the eighth transistor M8 which are switched on input the driving current into the micro light emitting diode L2 so as to drive the micro light emitting diode L2 to emit light.

In some embodiments of the present disclosure, the driving method of the display panel at the detection stage may further include: the first control circuit 110 in other areas except for the touch area is controlled to be switched on, the second control circuit 120 is controlled to be switched off, the pixel driving circuit 130 transmits the driving current to the organic light emitting diode L1, electrically connected with the pixel driving circuit 130, through the first control circuit 110 so as to control the organic light emitting diode L1 to emit light. The specific process may refer to the process of controlling the organic light emitting diode L1 to emit light and is not repeated herein.

Figure 4:
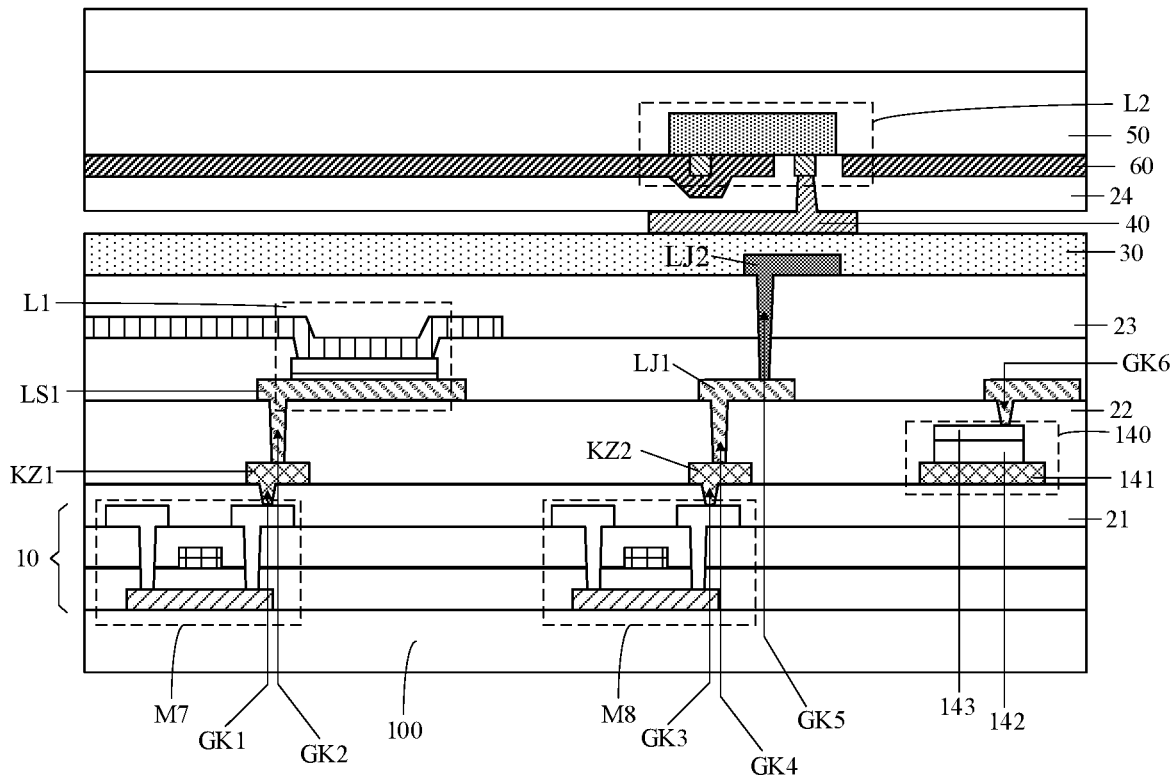
FIG. 4 is a sectional structural diagram of a display panel in an embodiment of the present disclosure.

In some embodiments of the present disclosure, as shown in FIG. 4, the display panel may include:
  a driving array layer, positioned on a base substrate 100, and the driving array layer including a pixel driving circuit 130, a first control circuit 110 and a second control circuit 120;
    a first insulating layer 21, positioned on the side, facing away from the base substrate 100, of the driving array layer;
    a photoelectric device layer, positioned on the side, facing away from the base substrate 100, of the first insulating layer 21, and the photoelectric device layer including a photoelectric converter 140;
    a second insulating layer 22, positioned on the side, facing away from the base substrate 100, of the photoelectric device layer;
    a first light emitting structure layer, positioned on the side, facing away from the base substrate 100, of the second insulating layer 22, and the first light emitting structure layer including an organic light emitting diode L1;
    a third insulating layer 23, positioned on the side, facing away from the base substrate 100, of the first light emitting structure layer; and
    a second light emitting structure layer, positioned on the side, facing away from the base substrate 100, of the third insulating layer 23, and the second light emitting structure layer including a micro light emitting diode L2.

In some embodiments of the present disclosure, as shown in FIG. 4, the photoelectric device layer may include:
  a first conducting layer, positioned on the side, facing away from the base substrate 100, of the first insulating layer 21, and the first conducting layer including a first control switching portion KZ1 and a first electrode 141 of the photoelectric converter 140;
  a photoelectric conversion structure layer, positioned on the side, facing away from the base substrate 100, of the first conducting layer, and the photoelectric conversion structure layer including a photoelectric conversion layer 142 of the photoelectric converter 140;
  a second conducting layer, positioned on the side, facing away from the base substrate 100, of the photoelectric conversion structure layer, and the second conducting layer including a second electrode 143 of the photoelectric converter 140; wherein
  the first control circuit 110 is electrically connected with the first control switching portion KZ1 through a first via hole GK1 penetrating through the first insulating layer 21, and the first control switching portion KZ1 is electrically connected with the first electrode of the organic light emitting diode L1 through a second via hole GK2 penetrating through the second insulating layer 22.

In some embodiments, as shown in FIG. 4, the second electrode of the seventh transistor M7 is electrically connected to the first control switching portion KZ1 through the first via hole GK1 penetrating through the first insulating layer 21, and the first control switching portion KZ1 is electrically connected to the first electrode of the organic light emitting diode LI through a second via hole GK2 penetrating through the second insulating layer 22.

In some embodiments, the first conducting layer may be made of metal, such that a first electrode of the photoelectric converter 140 may be arranged as a reflecting electrode. A second electrode of the photoelectric converter 140 may be a transparent electrode.

In some embodiments, the photoelectric conversion layer may include an N-type monocrystalline silicon layer, a monocrystalline silicon layer and a P-type monocrystalline silicon layer which are stacked on the first electrode of the photoelectric converter 140. Of course, the photoelectric conversion layer may also be another type of material capable of achieving a photoelectric conversion effect, and is not limited herein.

In some embodiments of the present disclosure, as shown in FIG. 4, the first light emitting structure layer may include: a first electrode of the organic light emitting diode LI, a light emitting layer and a second electrode of the organic light emitting diode L1 which are sequentially stacked on the second insulating layer 22. The first electrode of the organic light emitting diode L1 may be a reflecting electrode (such as an anode), the second electrode of the organic light emitting diode L1 may be a transparent electrode or a semitransparent electrode (such as a cathode), and the light emitting layer is made of an organic electroluminescent material.

In some embodiments of the present disclosure, as shown in FIG. 4, the first conducting layer may further include a second control switching portion KZ2; wherein the second control circuit 120 is electrically connected with the second control switching portion KZ2 through a third via hole GK3 penetrating through the first insulating layer 21. The second control switching portion KZ2 is electrically connected with the first electrode of the micro light emitting diode L2 through a fourth via hole GK4 penetrating through the second insulating layer 22 and a fifth via hole GK5 penetrating through the third insulating layer 23. In some embodiments, the second electrode of the eighth transistor M8 is electrically connected with the second control switching portion KZ2 through the third via hole GK3 penetrating through the first insulating layer 21.

In some embodiments of the present disclosure, as shown in FIG. 4, the display panel may further include: a first connecting layer LJ1 arranged on the same layer as the first electrode of the organic light emitting diode LI. The display panel further includes: a second connecting layer LJ2 positioned between the third insulating layer 23 and the second light emitting structure layer, and an anisotropic conductive adhesive film positioned between the second connecting layer LJ2 and the second light emitting structure layer. The second control switching portion KZ2 is electrically connected with the first connecting layer LJ1 through a fourth via hole GK4, the first connecting layer LJ1 is electrically connected with the second connecting layer LJ2 through a fifth via hole GK5, and the second connecting layer LJ2 is electrically connected with the first electrode of the micro light emitting diode L2 through the anisotropic conductive adhesive film.

In some embodiments of the present disclosure, as shown in FIG. 4, the display panel may further include: a detection trace arranged on the same layer as the first electrode of the organic light emitting diode LI. The detection trace is electrically connected to the second electrode of the photoelectric converter 140 through a sixth via hole GK6 penetrating through the second insulating layer 22. The detection trace is configured to provide a driving signal for the second electrode of the photoelectric converter 140, and the first electrode of the photoelectric converter 140 outputs a detection signal.

In some embodiments of the present disclosure, as shown in FIG. 4, the second light emitting structure layer may include:
- a reflective conducting layer, positioned on the side, facing away from the base substrate 100, of the third insulating layer 23, and the reflective conducting layer including a reflecting electrode 40; wherein an orthographic projection of the reflecting electrode 40 on the base substrate 100 is respectively not overlapped with an orthographic projection of an area, where the organic light emitting diode L1 is located, on the base substrate 100 and an orthographic projection of an area, where the photoelectric converter 140 is located, on the base substrate 100; and the orthographic projection of the reflecting electrode 40 on the base substrate 100 covers an orthographic projection of an area, where the micro light emitting diode L2 is located, on the base substrate 100;
- a micro-device insulating layer 24, positioned on the side, facing away from the base substrate, of the reflective conducting layer;
- a micro-device array layer, positioned on the side, facing away from the base substrate 100, of the micro-device insulating layer 24, and the micro-device array layer including the micro light emitting diode L2; and
- the reflecting electrode being electrically connected with the first electrode of the micro light emitting diode L2 through the fifth via hole GK5 penetrating through the micro-device insulating layer 24, and a first connecting portion being electrically connected with the reflecting electrode through the anisotropic conductive adhesive film. In some embodiments, the second connecting layer LJ2 being electrically connected with the reflecting electrode through the anisotropic conductive adhesive film.

In some embodiments of the present disclosure, as shown in FIG. 4, the second light emitting structure layer may include: a common electrode layer 60 positioned between the micro-device insulating layer 24 and the micro-device array layer. The common electrode layer 60 is electrically connected with the second electrode of the micro light emitting diode L2, and the common electrode layer 60 is insulated from the first electrode of the micro light emitting diode L2. For example, an orthographic projection of the common electrode layer 60 on the base substrate 100 is not overlapped with an orthographic projection of the first electrode of the micro light emitting diode L2 on the base substrate 100.

In some embodiments of the present disclosure, as shown in FIG. 4, the display panel may further include: a packaging substrate 200 positioned on the side, facing away from the base substrate 100, of the micro-device array layer, and an adhesion layer 50 positioned between the micro-device array layer and the packaging substrate 200. Thus, the micro light emitting diode L2 may adhere to the packaging substrate 200 through the adhesion layer 50.

Figure 5:
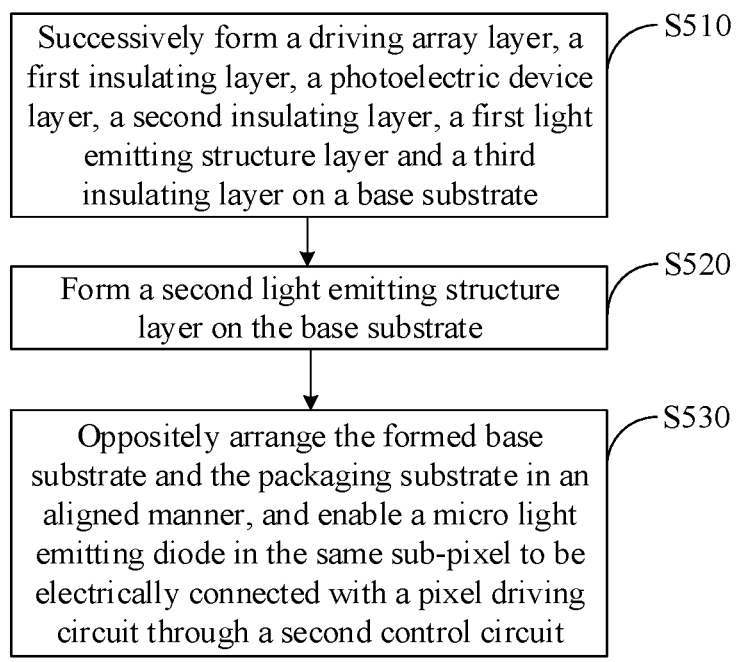
FIG. 5 is a process diagram of a manufacturing method in an embodiment of the present disclosure.

An embodiment of the present disclosure further provides a manufacturing method of a display panel. As shown in FIG. 5, the manufacturing method may include the following steps:

S510, a driving array layer, a first insulating layer, a photoelectric device layer, a second insulating layer, a first light emitting structure layer and a third insulating layer are successively formed on the base substrate; wherein the driving array layer includes a pixel driving circuit 130, a first control circuit 110 and a second control circuit 120; the photoelectric device layer includes a photoelectric converter 140; the first light emitting structure layer includes an organic light emitting diode L1; wherein in the same sub-pixel spx, the organic light emitting diode L1 is electrically connected with the pixel driving circuit 130 through the first control circuit 110;

S520, a second light emitting structure layer is formed on a packaging substrate; wherein the second light emitting structure layer includes a micro light emitting diode L2; and S530, the formed base substrate and the packaging substrate are oppositely arranged in an box alignment manner, and the micro light emitting diode in the same sub-pixel is enabled to be electrically connected with the pixel driving circuit through the second control circuit.

In some embodiments of the present disclosure, a first connecting layer LJ1 is formed while the first electrode of the organic light emitting diode L1 is formed; wherein the first connecting layer LJ1 is electrically connected with a second connecting portion through a fourth via hole GK4 penetrating through the second insulating layer 22.

In some embodiments of the present disclosure, the step that the formed base substrate 100 and the packaging substrate 200 are oppositely arranged in a box alignment manner may include:

the second connecting layer LJ2 is formed on the base substrate 100 on which the third insulating layer 23 is formed; wherein the second connecting layer LJ2 is electrically connected with the first connecting layer LJ1 through a fifth via hole GK5 penetrating through the third insulating layer 23;

an anisotropic conductive adhesive film is formed on the base substrate 100 on which the second connecting layer LJ2 is formed; or the anisotropic conductive adhesive film is formed on the packaging substrate 200 on which the second light emitting structure layer is formed; and after the formed base substrate 100 and the packaging substrate 200 are aligned, the second connecting layer LJ2 on the base substrate is electrically connected with the first electrode of the micro light emitting diode L2 on the packaging substrate 200 through the anisotropic conductive adhesive film by using a hot-pressing technology.

The structure of the display panel as shown in FIG. 4 is taken as an example to explain the manufacturing method provided by the embodiment of the present disclosure.

The manufacturing method provided by the embodiment of the present disclosure may include the following steps.

(1) The driving array layer, the first insulating layer 21, the photoelectric device layer, the second insulating layer 22, the first light emitting structure layer and the third insulating layer 23 are successively formed on the base substrate 100.

In some embodiments, at first, various transistors in the driving array layer are manufactured by a manufacturing process of a thin film transistor (TFT). The specific process may be basically the same as the specific process in the prior art, and is not repeated herein.

Then, the first insulating layer 21 is formed on the driving array layer. The first insulating layer 21 is provided with a first via hole GK1 and a third via hole GK3.

Then, the first electrode of the photoelectric device layer, the first control switching portion KZ1 and the second control switching portion KZ2 are formed on the first insulating layer 21. The first control switching portion KZ1 is electrically connected with the second electrode of the seventh transistor M7 through the first via hole GK1. The second control switching portion KZ2 is electrically connected with the second electrode of the eighth transistor M8 through the third via hole GK3.

Then, an N-type monocrystalline silicon layer, a monocrystalline silicon layer, a P-type monocrystalline silicon layer and the second electrode of the photoelectric device layer are successively formed on the first electrode of the photoelectric device layer.

Then, a second insulating layer 22 is formed on the side, facing away from the base substrate 100, of the second electrode of the photoelectric device layer. The second insulating layer 22 is provided with a second via hole GK2, a fourth via hole GK4 and a sixth via hole GK6.

Then, the first electrode of the organic light emitting diode L1, a pixel defining layer, a light emitting layer and the second electrode of the organic light emitting diode L1 are formed on the side, facing away from the base substrate 100, of the second insulating layer 22. The pixel defining layer is provided with an opening, and an orthographic projection of the opening on the base substrate 100 is positioned in an orthographic projection of the first electrode of the organic light emitting diode L1 on the base substrate 100.

Then, a third insulating layer 23 is formed on the side, facing away from the base substrate 100, of the second electrode of the organic light emitting diode L1.

(2) A second light emitting structure layer is formed on the packaging substrate 200; wherein the second light emitting structure layer includes the micro light emitting diode L2.

In some embodiments, at first, an adhesion layer covering the packaging substrate 200 is formed on the packaging substrate 200.

Then, a plurality of micro light emitting diodes L2 are transferred to the adhesion layer by using a mass transfer method.

Then, an isolating layer is formed on the second electrode of each micro light emitting diode L2. An orthographic projection of each isolating layer on the packaging substrate 200 is positioned in an orthographic projection of the corresponding micro light emitting diode L2 on the base substrate 100, the orthographic projection of each isolating layer on the packaging substrate 200 covers an orthographic projection of the second electrode of the corresponding micro light emitting diode L2 on the base substrate 100, and the orthographic projection of each isolating layer on the packaging substrate 200 is not overlapped with an orthographic projection of the first electrode of the corresponding micro light emitting diode L2 on the base substrate 100.

Then, a common electrode layer which covers the packaging substrate 200 is formed on the side, facing away from the packaging substrate 200, of each isolating layer.

Then, the isolating layers and the common electrode layers covering the isolating layers are removed by using a photolithographic technology so as to expose the first electrodes of the various micro light emitting diodes L2.

Then, a micro-device insulating layer 24 covering the packaging substrate 200 is formed on the side, facing away from the packaging substrate 200, of each common electrode layer.

Then, the micro-device insulating layers 24 above the first electrodes of the various micro light emitting diodes L2 are removed by using the photolithographic technology so as to expose the first electrodes of the various micro light emitting diodes L2.

Then, a reflecting electrode is formed on the side, facing away from the packaging substrate 200, of each micro-device insulating layer 24. One micro light emitting diode L2 is correspondingly provided with one reflecting electrode.

(3) The third insulating layer 23 is provided with a fifth via hole GK5 by using the photolithographic technology. The fifth via hole GK5 further penetrates through the pixel defining layer.

(4) The second connecting layer LJ2 is formed on the base substrate 100 on which the third insulating layer 23 is formed; wherein the second connecting layer LJ2 is electrically connected with the first connecting layer LJ1 through the fifth via hole GK5 penetrating through the third insulating layer 23.

(5) An anisotropic conductive adhesive film is formed on the base substrate 100 on which the second connecting layer LJ2 is formed.

(6) After the formed base substrate 100 and the packaging substrate 200 are aligned, the second connecting layer LJ2 on the base substrate 100 is electrically connected with the first electrode of the micro light emitting diode L2 on the packaging substrate 200 through the anisotropic conductive adhesive film by using a hot-pressing technology.

Based on the same inventive concept, an embodiment of the present disclosure further provides a display device, including the display panel provided by some embodiments of the present disclosure. The principle of the display device for solving the problems is similar to that of the display panel, so the implementation of the display device may refer to the implementation of the display panel, and repeated descriptions are omitted herein.

In some embodiments of the present disclosure, the display device may be: any product or component with a display function, such as a mobile phone, a tablet computer, a television, a display, a notebook computer, a digital photo frame and a navigator. Other essential components of the display device are understood by those skilled in the art, and are not described herein nor should they be construed as a limitation on the present disclosure.

It will be apparent to those skilled in the art that various changes and modifications can be made to the present disclosure without departing from the spirit and scope of the present disclosure. Thus, it is intended that the present disclosure also encompasses such changes and modifications as fall within the scope of the claims and their equivalents.

What is claimed is:

1. A display panel, comprising:
a base substrate with a display area; wherein:
the display area comprises a plurality of sub-pixels; the display area comprises a recognition area; each sub-pixel in the recognition area comprises: a pixel driving circuit, a first control circuit, a second control circuit, an organic light emitting diode, a micro light emitting diode and a photoelectric converter;
in each sub-pixel, the organic light emitting diode is electrically connected with the pixel driving circuit through the first control circuit, and the micro light emitting diode is electrically connected with the pixel driving circuit through the second control circuit; and
the photoelectric converter is configured to receive light which is emitted by the micro light emitting diode and is reflected by a finger;
wherein the display panel further comprises:
a driving array layer, positioned on the base substrate, and the driving array layer comprises the pixel driving circuit, the first control circuit and the second control circuit;
a first insulating layer, positioned on a side, facing away from the base substrate, of the driving array layer;
a photoelectric device layer, positioned on a side, facing away from the base substrate, of the first insulating layer; and the photoelectric device layer comprises the photoelectric converter;
a second insulating layer, positioned on a side, facing away from the base substrate, of the photoelectric device layer;
a first light emitting structure layer, positioned on a side, facing away from the base substrate, of the second insulating layer, and the first light emitting structure layer comprises the organic light emitting diode;
a third insulating layer, positioned on a side, facing away from the base substrate, of the first light emitting structure layer; and
a second light emitting structure layer, positioned on a side, facing away from the base substrate, of the third insulating layer, and the second light emitting structure layer comprises the micro light emitting diode.

2. The display panel according to claim 1, wherein the photoelectric device layer comprises:
a first conducting layer, positioned on the side, facing away from the base substrate, of the first insulating layer, and the first conducting layer comprises a first control switching portion and a first electrode of the photoelectric converter;
a photoelectric conversion structure layer, positioned on a side, facing away from the base substrate, of the first conducting layer, and the photoelectric conversion structure layer comprises a photoelectric conversion layer of the photoelectric converter; and
a second conducting layer, positioned on a side, facing away from the base substrate, of the photoelectric conversion structure layer, and the second conducting layer comprises a second electrode of the photoelectric converter; wherein
the first control circuit is electrically connected with the first control switching portion through a first via hole penetrating through the first insulating layer, and the first control switching portion is electrically connected with the first electrode of the organic light emitting diode through a second via hole penetrating through the second insulating layer.

3. The display panel according to claim 2, wherein the first conducting layer further comprises a second control switching portion; wherein the second control circuit is electrically connected to the second control switching portion through a third via hole penetrating through the first insulating layer; and
the second control switching portion is electrically connected with the first electrode of the micro light emitting diode through a fourth via hole penetrating through the second insulating layer and a fifth via hole penetrating through the third insulating layer.

4. The display panel according to claim 3, further comprises: a first connecting layer arranged on a layer same as a layer on which the first electrode of the organic light emitting diode is;
the display panel further comprises: a second connecting layer positioned between the third insulating layer and the second light emitting structure layer, and an anisotropic conductive adhesive film positioned between the second connecting layer and the second light emitting structure layer; and
the second control switching portion is electrically connected with the first connecting layer through the fourth via hole, the first connecting layer is electrically connected with the second connecting layer through the fifth via hole, and the second connecting layer is electrically connected with the first electrode of the micro light emitting diode through the anisotropic conductive adhesive film.

5. The display panel according to claim 4, wherein the second light emitting structure layer comprises:
a reflective conducting layer, positioned on a side, facing away from the base substrate, of the third insulating layer, and the reflective conducting layer comprises a reflecting electrode; wherein an orthographic projection of the reflecting electrode on the base substrate is not overlapped with an orthographic projection of the organic light emitting diode on the base substrate and an orthographic projection of the photoelectric converter on the base substrate; and the orthographic projection of the reflecting electrode on the base substrate covers an orthographic projection of the micro light emitting diode on the base substrate;

a micro-device insulating layer, positioned on a side, facing away from the base substrate, of the reflective conducting layer;

a micro-device array layer, positioned on a side, facing away from the base substrate, of the micro-device insulating layer, and the micro-device array layer comprises the micro light emitting diode; and the reflecting electrode is electrically connected with the first electrode of the micro light emitting diode through the fifth via hole penetrating through the micro-device insulating layer, and a first connecting portion is electrically connected with the reflecting electrode through the anisotropic conductive adhesive film.

6. The display panel according to claim 1, wherein the recognition area is overlapped with the display area.

7. A display device, comprising: a display panel, wherein the panel comprises:

a base substrate with a display area; wherein:

the display area comprises a plurality of sub-pixels; the display area comprises a recognition area; each sub-pixel in the recognition area comprises: a pixel driving circuit, a first control circuit, a second control circuit, an organic light emitting diode, a micro light emitting diode and a photoelectric converter;

in each sub-pixel, the organic light emitting diode is electrically connected with the pixel driving circuit through the first control circuit, and the micro light emitting diode is electrically connected with the pixel driving circuit through the second control circuit; and the photoelectric converter is configured to receive light which is emitted by the micro light emitting diode and is reflected by a finger;

wherein the panel further comprises:

a driving array layer, positioned on the base substrate, and the driving array layer comprises the pixel driving circuit, the first control circuit and the second control circuit;

a first insulating layer, positioned on a side, facing away from the base substrate, of the driving array layer;

a photoelectric device layer, positioned on a side, facing away from the base substrate, of the first insulating layer, and the photoelectric device layer comprises the photoelectric converter;

a second insulating layer, positioned on a side, facing away from the base substrate, of the photoelectric device layer;

a first light emitting structure layer, positioned on a side, facing away from the base substrate, of the second insulating layer, and the first light emitting structure layer comprises the organic light emitting diode;

a third insulating layer, positioned on a side, facing away from the base substrate, of the first light emitting structure layer; and a second light emitting structure layer, positioned on a side, facing away from the base substrate, of the third insulating layer, and the second light emitting structure layer comprising the micro light emitting diode.

8. The display device according to claim 7, wherein the photoelectric device layer comprises:

a first conducting layer, positioned on the side, facing away from the base substrate, of the first insulating layer, and the first conducting layer comprises a first control switching portion and a first electrode of the photoelectric converter;

a photoelectric conversion structure layer, positioned on the side, facing away from the base substrate, of the first conducting layer, and the photoelectric conversion structure layer comprises a photoelectric conversion layer of the photoelectric converter; and a second conducting layer, positioned on the side, facing away from the base substrate, of the photoelectric conversion structure layer, and the second conducting layer comprises a second electrode of the photoelectric converter; wherein the first control circuit is electrically connected with the first control switching portion through a first via hole penetrating through the first insulating layer, and the first control switching portion is electrically connected with the first electrode of the organic light emitting diode through a second via hole penetrating through the second insulating layer.

9. The display device according to claim 8, wherein the first conducting layer further comprises a second control switching portion; wherein the second control circuit is electrically connected to the second control switching portion through a third via hole penetrating through the first insulating layer; and the second control switching portion is electrically connected with the first electrode of the micro light emitting diode through a fourth via hole penetrating through the second insulating layer and a fifth via hole penetrating through the third insulating layer.

10. The display device according to claim 9, wherein the display panel further comprises: a first connecting layer arranged on a layer same as a layer on which the first electrode of the organic light emitting diode is;

the display panel further comprises: a second connecting layer positioned between the third insulating layer and the second light emitting structure layer, and an anisotropic conductive adhesive film positioned between the second connecting layer and the second light emitting structure layer; and the second control switching portion is electrically connected with the first connecting layer through the fourth via hole, the first connecting layer is electrically connected with the second connecting layer through the fifth via hole, and the second connecting layer is electrically connected with the first electrode of the micro light emitting diode through the anisotropic conductive adhesive film.

11. The display device according to claim 10, wherein the second light emitting structure layer comprises:

a reflective conducting layer, positioned on a side, facing away from the base substrate, of the third insulating layer, and the reflective conducting layer comprises a reflecting electrode; wherein an orthographic projection of the reflecting electrode on the base substrate is not overlapped with an orthographic projection of the organic light emitting diode on the base substrate and an orthographic projection of the photoelectric converter on the base substrate; and the orthographic projection of the reflecting electrode on the base substrate covers an orthographic projection of the micro light emitting diode on the base substrate;

a micro-device insulating layer, positioned on a side, facing away from the base substrate, of the reflective conducting layer;

a micro-device array layer, positioned on a side, facing away from the base substrate, of the micro-device insulating layer, and the micro-device array layer comprises the micro light emitting diode; and the reflecting electrode is electrically connected with the first electrode of the micro light emitting diode through the fifth via hole penetrating through the micro-device insulating layer, and a first connecting portion is electrically connected with the reflecting electrode through the anisotropic conductive adhesive film.

12. The display device according to claim 7, wherein the recognition area is overlapped with the display area.

13. A manufacturing method of the display panel according to claim 1, comprising:
   successively forming the driving array layer, the first insulating layer, the photoelectric device layer, the second insulating layer, the first light emitting structure layer and the third insulating layer on the base substrate;
   forming the second light emitting structure layer on a packaging substrate; and
   oppositely arranging formed base substrate and the packaging substrate in a box alignment manner so that the micro light emitting diode in each sub-pixel is electrically connected with the pixel driving circuit through the second control circuit.

14. The manufacturing method according to claim 13, further comprises: forming a first connecting layer while the first electrode of the organic light emitting diode is formed; wherein the first connecting layer is electrically connected to a second connecting portion through a fourth via hole penetrating through the second insulating layer;
   the oppositely arranging the formed base substrate and the packaging substrate in a box alignment manner comprises:
   forming a second connecting layer on the base substrate on which the third insulating layer is formed; wherein the second connecting layer is electrically connected with the first connecting layer through a fifth via hole penetrating through the third insulating layer;
   forming an anisotropic conductive adhesive film on the base substrate on which the second connecting layer is formed; or forming an anisotropic conductive adhesive film on the packaging substrate on which the second light emitting structure layer is formed; and
   after the formed base substrate and the packaging substrate are aligned, electrically connecting the second connecting layer on the base substrate with the first electrode of the micro light emitting diode on the packaging substrate through the anisotropic conductive adhesive film by adopting a hot-pressing technology.

15. A driving method of the display panel according to claim 1, comprising:
   at a display stage, switching on the first control circuit, switching off the second control circuit, and transmitting, by the pixel driving circuit, a driving current to the organic light emitting diode, electrically connected with the pixel driving circuit, through the first control circuit so as to control the organic light emitting diode to emit light; and
   at a detection stage, determining a touch area for fingers on the display panel, controlling the first control circuit in the touch area to be switched off, controlling the second control circuit to emit light, transmitting, by the pixel driving circuit, the driving current to the micro light emitting diode, electrically connected with the pixel driving circuit, through the second control circuit so as to control the micro light emitting diode to emit light; receiving, by the photoelectric converter, the light emitted by the micro light emitting diode and reflected by a finger, and outputting a detection signal; and determining fingerprint information of the finger according to the detection signal.

16. The driving method according to claim 15, wherein at the detection stage, further comprises:
   controlling the first control circuit in other areas except for the touch area to be switched on, controlling the second control circuit to be switched off, and transmitting, by the pixel driving circuit, the driving current to the organic light emitting diode, electrically connected with the pixel driving circuit, through the first control circuit so as to control the organic light emitting diode to emit light.

* * * * *